US010538422B2

(12) United States Patent
Lijian et al.

(10) Patent No.: US 10,538,422 B2
(45) Date of Patent: Jan. 21, 2020

(54) PLUG-IN CONTROLLER ASSEMBLY FOR A PALLET TRUCK

(71) Applicant: Zhejiang E-P Equipment Co., Ltd., Hangzhou (CN)

(72) Inventors: Weng Lijian, Hangzhou (CN); Wei Kaifeng, Hangzhou (CN); Yu Jiandong, Hangzhou (CN); Xu Linjie, Hangzhou (CN); Huang Wenlong, Hangzhou (CN)

(73) Assignee: Zhejiang E-P Equipment Co., Ltd. (CN)

( * ) Notice: Subject to any disclaimer, the term of this patent is extended or adjusted under 35 U.S.C. 154(b) by 0 days.

(21) Appl. No.: 16/386,815

(22) Filed: Apr. 17, 2019

(65) Prior Publication Data
US 2019/0322510 A1    Oct. 24, 2019

(30) Foreign Application Priority Data

Apr. 19, 2018  (CN) .......................... 2018 2 0566740

(51) Int. Cl.
*B66F 9/24*      (2006.01)
*B60R 16/023*    (2006.01)
*H05K 5/00*      (2006.01)
*H05K 5/02*      (2006.01)
*H05K 5/03*      (2006.01)

(52) U.S. Cl.
CPC ............ *B66F 9/24* (2013.01); *B60R 16/0239* (2013.01); *H05K 5/0008* (2013.01); *H05K 5/0017* (2013.01); *H05K 5/0247* (2013.01); *H05K 5/03* (2013.01)

(58) Field of Classification Search
CPC ..... B66F 9/24; B60R 16/0239; H05K 5/0008; H05K 5/0247; H05K 5/03; H05K 5/0017
See application file for complete search history.

(56) References Cited

U.S. PATENT DOCUMENTS

| 4,756,978 | A  | * | 7/1988 | Nitcher | H01M 2/1077 180/68.5 |
| 8,412,431 | B2 | * | 4/2013 | Wetterer | B66F 9/07509 701/69 |
| 8,413,947 | B2 | * | 4/2013 | Chiang | B62M 6/90 248/553 |
| 9,421,963 | B2 | * | 8/2016 | Wetterer | B66F 9/07509 |
| 9,718,661 | B1 | * | 8/2017 | Hoffman | B66F 9/24 |
| 2007/0137904 | A1 | * | 6/2007 | Rose | B62B 3/0612 180/19.1 |
| 2010/0025126 | A1 | * | 2/2010 | Nakatsu | B60L 11/00 180/65.1 |
| 2014/0195127 | A1 | * | 7/2014 | Hoffman | B66F 9/24 701/50 |

(Continued)

*Primary Examiner* — Abhishek M Rathod
(74) *Attorney, Agent, or Firm* — Cook Alex Ltd.

(57) ABSTRACT

A plug-in controller for a pallet truck including a controller box, a control unit and a controller base. The control unit is enclosed by the controller box and a lower end of the controller box has a receptacle, while the controller base includes a raised socket. The controller box receptacle receives the raised socket of the controller base and a controller cable plug-in header and a controller signal line plug-in header provided by the receptacle engage and connect to a respective controller cable plug-in header and a controller signal line plug-in header provided by the controller base.

10 Claims, 4 Drawing Sheets

(56) References Cited

U.S. PATENT DOCUMENTS

2015/0102274 A1* 4/2015 He .................. B62B 3/0618
                                                  254/2 C
2015/0266543 A1* 9/2015 Marioni ............ B62M 6/90
                                                  180/207.3
2018/0009643 A1* 1/2018 Hoffman ........... B62B 3/0612

* cited by examiner

PLUG-IN CONTROLLER ASSEMBLY FOR A PALLET TRUCK

CROSS-REFERENCE TO RELATED APPLICATION

This application claims priority to Chinese Patent Application No. 201820566740.5, filed Apr. 19, 2018, which is hereby incorporated by reference in its entirety.

TECHNICAL FIELD

The invention relates to a material handling equipment, and more particularly to pallet tucks and a plug-in controller assembly for a pallet truck.

BACKGROUND

Pallet trucks are used as logistics equipment to carry goods. The forks of a manual pallet truck are inserted into holes of a pallet when used in a pallet handling station. A hydraulic system of a manual pallet truck is driven by manpower to cause the lifting and descending of cargo on a pallet, and the pallet handling operation is completed by manpower of the user pulling the pallet truck. A pallet truck is the most simple, effective and common loading and unloading material handling tool in pallet conveyance of a pallet handling station.

The introduction of powered pallet trucks reduced the extent of manpower required. But at present, there still are some problems with existing pallet trucks. For instance, the controller of an existing pallet truck is fixed on the equipment, typically covered by a body panel and the equipment needs to be disassembled to be repaired and/or replaced when a failure occurs. At that time, the vehicle cannot be used, which greatly affects the timely and efficient use of the equipment.

SUMMARY

One of the purposes of this disclosure is to provide a plug-in and pull-out controller assembly for a pallet truck, with quick and convenient installation and disassembly. The second purpose of the disclosure is to provide a pallet truck with appropriate structure to utilize the controller assembly.

In order to achieve the first purpose, the disclosure provides a plug-in controller assembly that includes a controller box, a control unit and a controller base. The control unit is fixed in the controller box. The lower end of the controller box includes a receptacle and that is provided with a controller cable female plug-in header and a controller signal line female plug-in header. The controller base includes a raised socket that is provided with a controller cable male plug-in header and a controller signal line male plug-in header. The raised socket of the controller base is received by receptacle of the controller box when the controller assembly is plugged into the pallet truck, which results in connection of the controller cable female plug-in header and the controller signal line female plug-in header with the controller cable male plug-in header and the controller male signal line plug-in header, respectively.

In the preferred embodiment, the controller box may be formed by fixing the back cover of the control box to the front cover of the control box, and fixing the control unit within the control box and to the back cover.

Also, in the preferred embodiment, the top of the receptacle includes a controller plug-in bracket that is fixed to the back cover and the front cover of the control box, and the controller cable female plug-in header and controller signal line female plug-in header are fixed to the controller plug-in bracket.

Still further, in the preferred embodiment, the controller base is provided with amp that engages and releasably retains the controller plug-in bracket.

In order to achieve the second purpose mentioned above, the disclosure includes a pallet truck to which the controller base is fixed.

The disclosure provides for integral plug-in of the controller assembly by providing a controller box that plugs into a controller base. When a controller fault occurs, the maintenance of the equipment can be completed by simply pulling out and replacing the controller module, thus improving the maintenance efficiency and productivity of the equipment.

DETAILED DESCRIPTION OF THE PREFERRED EMBODIMENT

Figure 1:
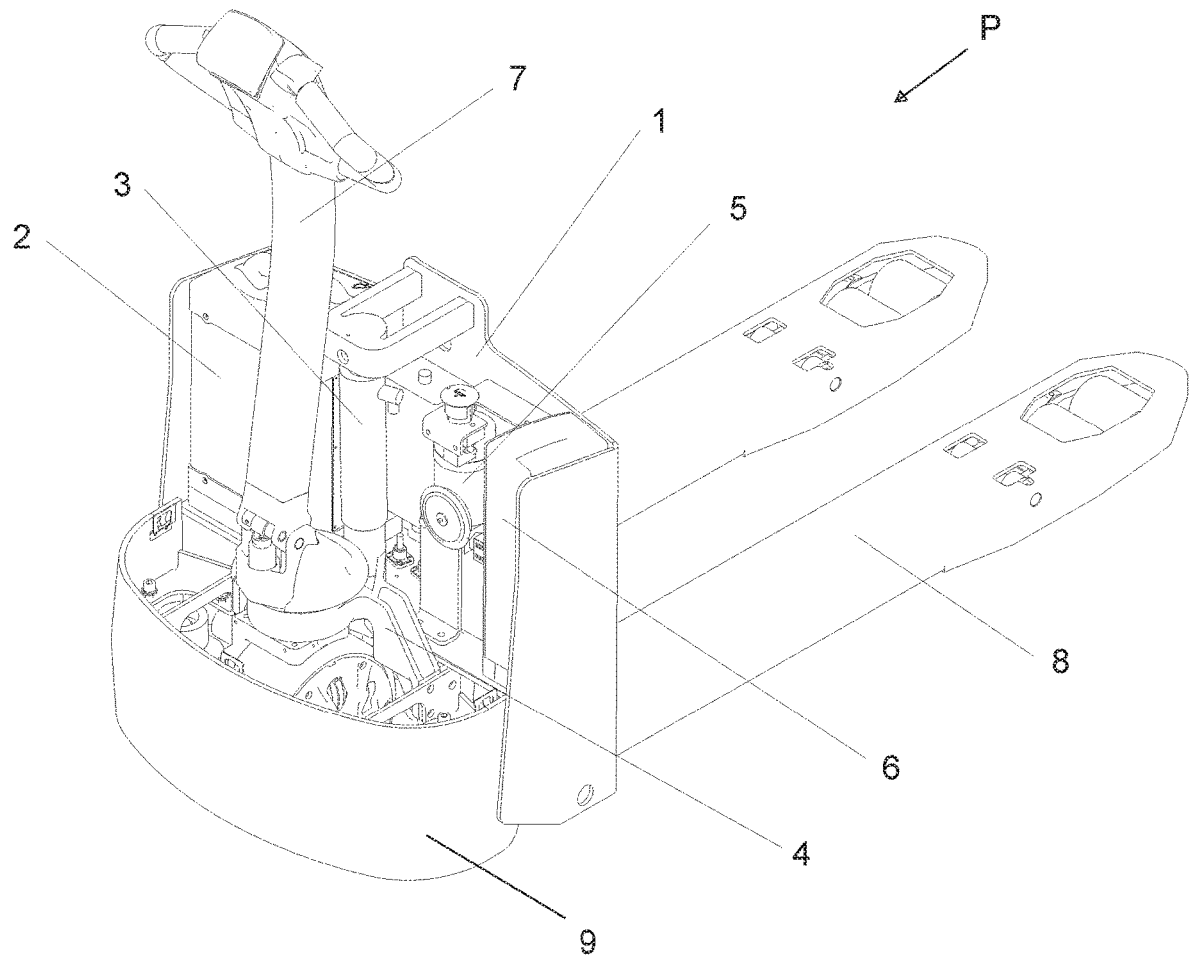
FIG. 1 is a schematic diagram of a pallet truck in accordance with the present disclosure.

An embodiment of a pallet truck is described in detail below, and an example of the embodiment is shown in the drawings in which identical or similar labels throughout represent identical or similar elements, or elements with the same or similar functions. The following embodiments described with reference to the drawings are illustrative and are intended to be used to explain, rather than to limit the disclosure.

An example pallet truck P is shown in FIGS. 1-4, with some structure removed for convenience of viewing. The pallet truck P has a front frame 1 connected to a drive unit 4 through a hydraulic lift cylinder 3. A hydraulic supply system 5, a controller assembly 6 and a battery assembly 2 are installed side by side on the front frame 1. The battery assembly 2 is located on one side of the lift cylinder 3, and the hydraulic supply system 5 and the controller assembly 6 are located on the other side of the lift cylinder 3. The battery assembly 2 and the controller assembly 6 are connected to the front frame 1 and configured to be of a plug-in and pull-out type. An operation handle 7 is arranged on the drive unit 4, and the front frame 1 also is provided with front forks 8, and the pallet truck P may include a rear frame 9 connected to an extending outward from the drive unit 4.

Figure 2:
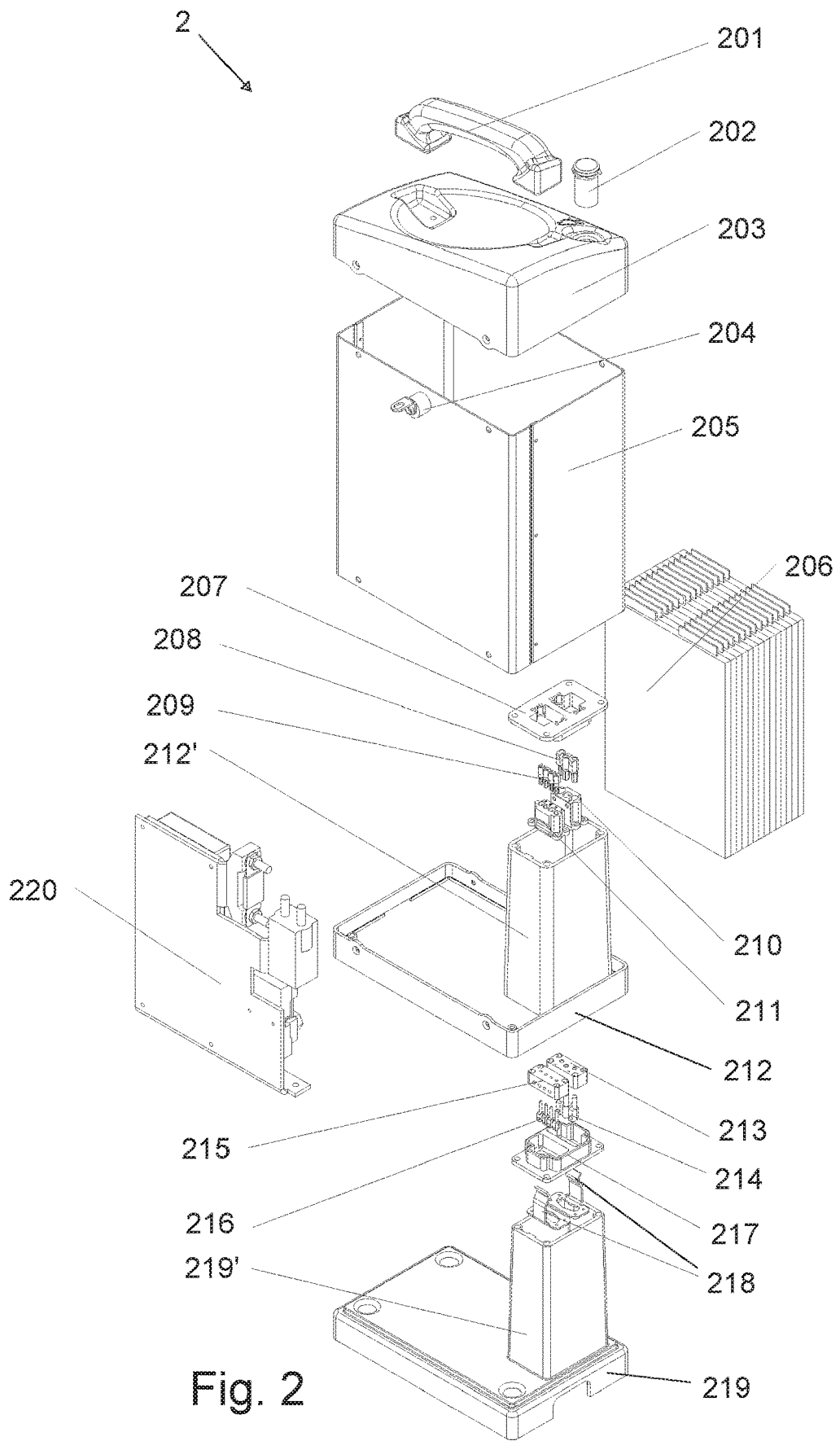
FIG. 2 is a schematic diagram of a plug-in battery assembly of a pallet truck in accordance with the present disclosure.

As shown in FIG. 2, the battery assembly 2 includes a battery box that encloses a power source, such as a lithium battery 206, and plugs into a battery base 219, which is configured to be mounted to the front frame 1 of the pallet truck P. The battery box includes a battery cable female plug-in header 210 and a battery signal line female plug-in header 211. The battery box is fixedly assembled, such as by screws that connect a battery top 203 and a battery bottom 212 to a battery sidewall 205. The lithium battery 206 is fixed in the battery box on the battery bottom 212, and the battery bottom 212 is provided with an upward raised hollow guide column 212'. The hollow guide column 212' is located at one corner of the battery bottom 212. The battery assembly 2 also may include a handle 201, a switch 202 and a light emitting diode (LED) lamp 204 mounted on the battery top 203 of the battery assembly 2, respectively. A battery management system (BMS) module 220 is fixed on the battery bottom 212.

A first battery plug-in bracket 207 is fixed to the upper end of the hollow guide column 212', and the battery cable female plug-in header 210 and the battery signal line female plug-in header 211 are fixed in the first battery plug-in bracket 207, such as by at least one screw, respectively. In addition, a battery cable pin assembly 208 and a battery signal line pin assembly 209 are respectively fixed, such as by a least one screw, to the battery cable female plug-in header 210 and the battery signal line female plug-in header 211.

The position of the hollow guide column 212' corresponds to an upward raised guide block 219' on a battery base 219. Fixed to an upper end of the guide block 219' is a second battery plug-in bracket 217. A battery cable male plug-in header 213 and a battery signal line male plug-in header 215 are fixed in the second battery plug-in bracket 217 at the upper end of the guide block 219', such as by at least one screw, respectively. Also, a battery cable plug-in pin assembly 214 and a battery signal line plug-in pin assembly 216 are respectively fixed, such as by at least one screw, to the battery cable male plug-in header 213 and the battery signal line male plug-in header 215.

The upper end of the raised guide block 219' is provided with the battery cable male plug-in header 213 and the battery signal line male plug-in header 215. The battery box may be plugged into the battery base 219, which makes the connection of the battery box with the guide block 219' via the hollow guide column 212'. Thus, with the battery assembly 2, a user may plug-in the battery box to the battery base 219, which causes the battery cable female plug-in header 210 and its battery cable pin assembly 208 to receive and connect to the battery cable male plug-in header 213 and its battery cable plug-in pin assembly 214, and causes the battery signal line female plug-in header 211 and its battery signal line pin assembly 209 to receive and connect to the battery signal line male plug-in header 215 and its battery signal line plug-in pin assembly 216.

In this example, the hollow guide column 212' has a height and the guide block 219' has a height that is substantially the same as the height of the hollow guide column 212'. Also, the battery sidewall 205 has a height and the height of the hollow guide column 212' is greater than two-thirds of the height of the battery sidewall 205. This helps stabilize the connection, which also is aided by having the second battery plug-in bracket 217 be provided with a releasable clamp 218 having two prongs that engage and releasably retain the first plug in bracket 207 when the battery box is plugged into the battery base 219. It will be appreciated that in light of the above structures, a user may quickly and conveniently pull-out the battery box from the battery base 219, if for instance, the battery needs to be serviced or replaced, without having to disassemble any of the rest of the pallet truck P.

Figure 3:
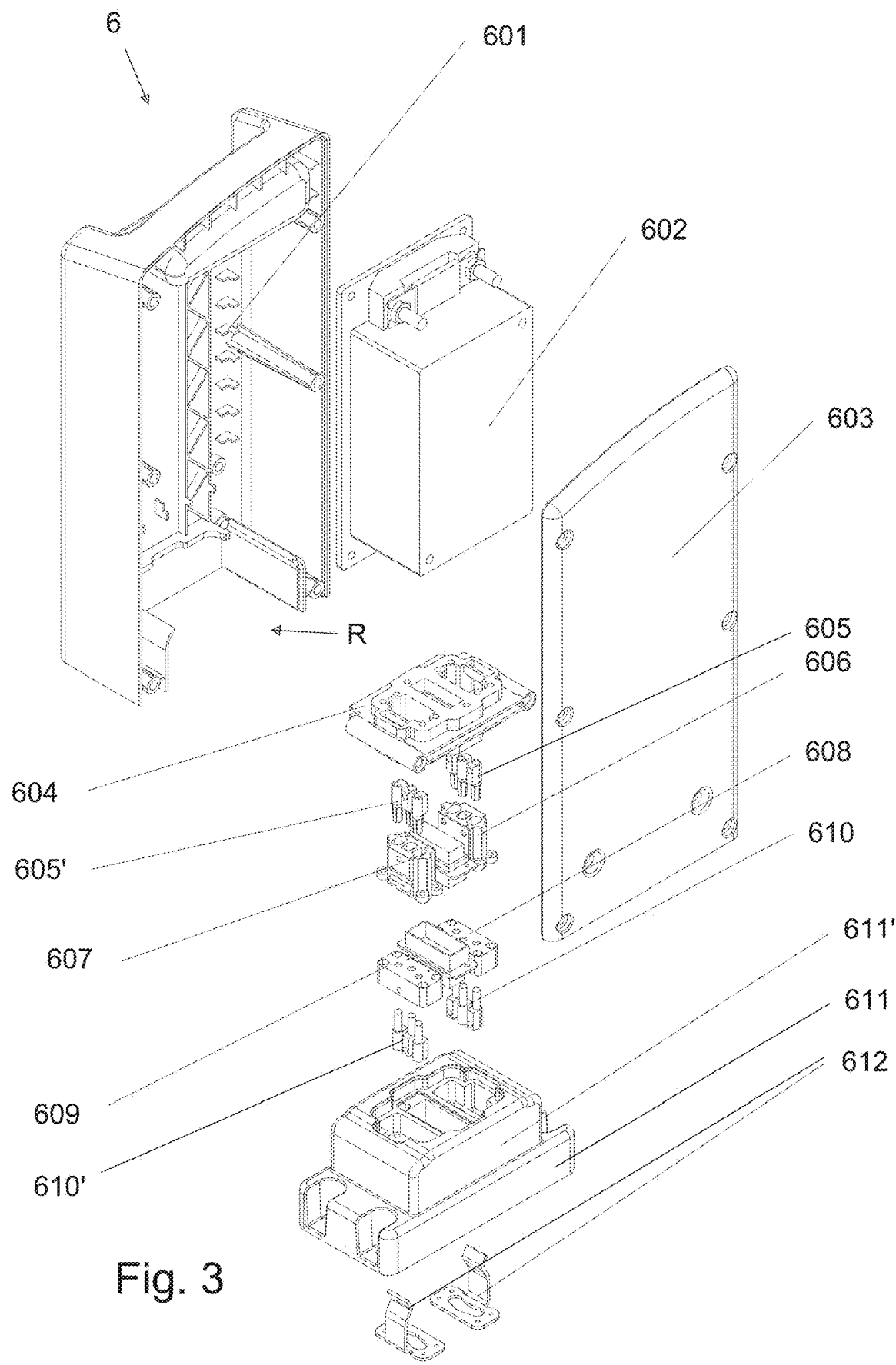
FIG. 3 is a schematic diagram of a plug-in controller assembly of a pallet truck in accordance with the present disclosure.

As shown in FIG. 3, the controller assembly 6 includes a controller box that encloses a control unit 602 and plugs into a controller base 611. The controller box is formed by a back cover 601 and a front cover 603 being fixedly connected, such as by at least one screw, and the control unit 602 is enclosed in the controller box and may be fixed to the back cover 601, such as by at least one screw. A lower end of the controller box is provided with a receptacle R that that receives the controller base 611. The controller base 611 is configured to be mounted on the front frame 1 of the pallet truck P. The internal top of the receptacle R is provided with a controller plug-in bracket 604, which is fixed to the back cover 601 and to the front cover 603 of the controller box, such as by at least one screw, respectively. A controller cable female plug-in header 606 is fixed, such as by at least one screw, to a controller cable pin assembly 605, and a controller signal line female plug-in header 607 is fixed, such as by at least one screw, to a controller signal line pin assembly 605'.

An upper part of the controller base 611 includes a raised socket 611'. A controller cable male plug-in header 608 and a controller signal line male plug-in header 609 are arranged in the socket 611' of the controller base 611. Also, a controller cable plug-in pin assembly 610 is fixed, such as by at least one screw, to the controller cable male plug-in header 608, while the controller signal line plug-in pin assembly 610' is fixed, such as by at least one screw, to the controller signal line male plug-in header 609. Thus, with the controller assembly 6, a user may plug-in the controller box to the controller base 611, which causes the socket 611' of the controller base on the front frame 1 of the pallet truck P to be received by the receptacle R in the bottom of the controller box, and causes the controller cable female plug-in header 606 and its controller cable pin assembly 605 to receive and connect to the controller cable male plug-in header 608 and its controller cable plug-in pin assembly 610, and causes the controller signal line female plug-in header 607 and its controller signal line pin assembly 605' to receive and connect to the controller signal line male plug-in header 609 and its controller signal line plug-in pin assembly 610'.

The controller base 611 also is provided with a clamp 612 having two prongs that engage and releasably retain the controller plug-in bracket 604 when the controller box is plugged-in and the receptacle R receives the raised socket 611' of the controller base 611. It will be appreciated that in light of the above structures, a user also may quickly and conveniently pull-out the controller box from the controller base 611, if for instance, the controller box needs to be serviced or replaced, without having to disassemble any of the rest of the pallet truck P.

Figure 4:
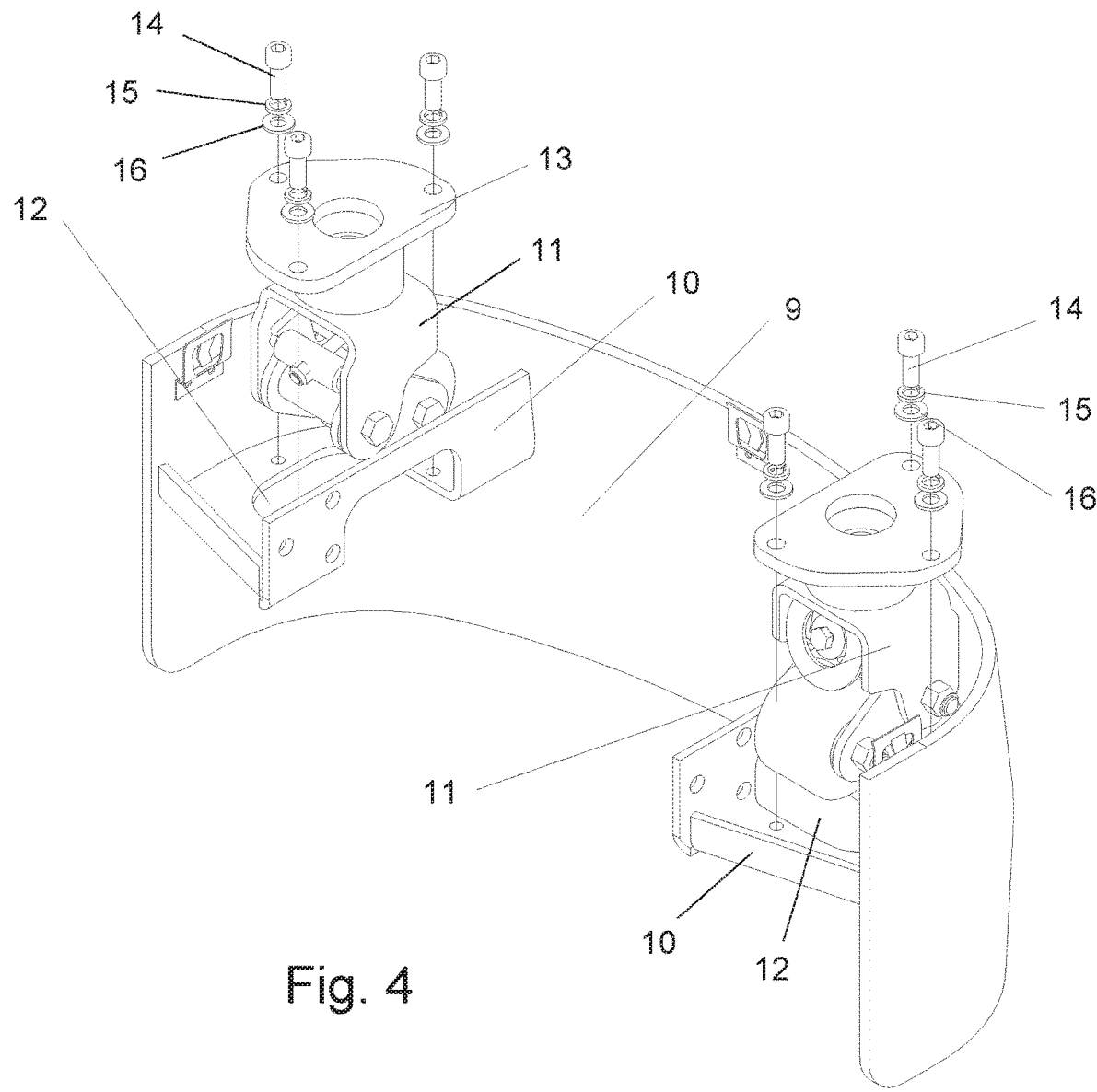
FIG. 4 is a schematic diagram of a rear frame and caster wheel assemblies of a pallet truck in accordance with the present disclosure.

FIG. 4 shows a rear frame 9 of the pallet truck P, which includes a pair of caster wheel assemblies. The inner sides of both ends of the rear frame 9 are fixed to mounting brackets 10 which are connected to the drive unit 4, respectively. Each mounting bracket 10 is provided with an opening 12. A lower face of a fixing plate 13 at the top of a caster wheel assembly 11 is fixed to an upper face of the mounting bracket 10 proximate the respective opening 12, such as by at least one screw 14.

The outer side of the mounting bracket 10 is vertically fixed to the rear frame 9, and the inner side of the mounting bracket 10 is folded upward to form a connecting side plate. The two sides of the drive unit 4 are fixed to the respective two connecting side plates, such as by at least one screw, and the opening 12 extends to the connecting side plate. A lock washer 15 and a flat washer 16 also are arranged between the screw 14 and the fixing plate 13 at the top of each caster wheel assembly 11, and the rear frame 9 forms an arc-shaped connection plate as a whole. Having the fixing plates 13 of the caster wheel assemblies 11 mount downward against the upper surface of the mounting brackets 10 advantageously permits disassembly and installation of the caster wheels assemblies 11 without the cumbersome and potentially dangerous need to lift the pallet truck P.

It should be noted that the above embodiments are only representative examples of the pallet truck of the present disclosure which may have many different configurations. Any equivalent to or modification of the above embodiments according to the essence of the disclosure shall be considered to be within the scope of the disclosure.

The invention claimed is:

1. A plug-in controller for a pallet truck, comprising:
a controller box, a control unit and a controller base;
the controller box enclosing the control unit;
a lower end of the controller box having a receptacle and providing a controller cable plug-in header and a controller signal line plug-in header;
the controller base having a raised socket and providing a controller cable plug-in header and a controller signal line plug-in header;
wherein when the controller box is plugged-into the controller base, the receptacle of the controller box receives the raised socket of the controller base and the controller cable plug-in header and the controller signal line plug-in header in the receptacle of the controller box engage and connect to the respective controller cable plug-in header and the controller signal line plug-in header in the raised socket of the controller base.

2. The plug-in controller for a pallet truck in accordance with claim 1, wherein the controller box further comprises a back cover connected to a front cover, and with the control unit being connected to the back cover.

3. The plug-in controller for a pallet truck in accordance with claim 2, wherein the back cover is connected to the front cover by at least one screw and the control unit is connected to the back cover by at least one screw.

4. The plug-in controller for a pallet truck in accordance with claim 1, wherein the controller box further comprises a controller plug-in bracket that is located at an internal top of the receptacle and connected to the back cover and to the front cover of the controller box.

5. The plug-in controller for a pallet truck in accordance with claim 4, wherein the controller plug-in bracket is connected to each of the back cover and the front cover by at least one screw, respectively.

6. The plug-in controller for a pallet truck in accordance with claim 4, wherein the controller base further comprises a clamp that engages and releasably retains the controller plug-in bracket in the receptacle of the controller box when the controller box is plugged into the controller base.

7. The plug-in controller for a pallet truck in accordance with claim 1, wherein the controller cable plug-in header and a controller signal line plug-in header of the controller base raised socket further comprise a controller cable male plug-in header and a controller signal line male plug-in header.

8. The plug-in controller for a pallet truck in accordance with claim 7, further comprising a controller cable plug-in pin assembly fixed to the controller cable male plug-in header, and a controller signal line plug-in pin assembly fixed to the controller signal line male plug-in header.

9. The plug-in controller for a pallet truck in accordance with claim 1, wherein the controller cable plug-in header and a controller signal line plug-in header provided by the receptacle of the controller box further comprise a controller cable female plug-in header and a controller signal line female plug-in header.

10. The plug-in controller for a pallet truck in accordance with claim 9, further comprising a controller cable pin assembly fixed to the controller cable female plug-in header, and a controller signal line pin assembly fixed to the controller signal line female plug-in header.

* * * * *